United States Patent
Yang et al.

(10) Patent No.: US 7,505,298 B2
(45) Date of Patent: Mar. 17, 2009

(54) TRANSFER OF NON-ASSOCIATED INFORMATION ON FLASH MEMORY DEVICES

(75) Inventors: Nian Yang, Mountainview, CA (US); Yonggang Wu, Santa Clara, CA (US); Tien-Chun Yang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/741,996

(22) Filed: Apr. 30, 2007

(65) Prior Publication Data

US 2008/0266926 A1    Oct. 30, 2008

(51) Int. Cl.
*G11C 5/06* (2006.01)
*G11C 7/10* (2006.01)

(52) U.S. Cl. ............... 365/63; 365/189.02; 365/189.04
(58) Field of Classification Search .............. 365/63
See application file for complete search history.

(56) References Cited

U.S. PATENT DOCUMENTS

| | | | |
|---|---|---|---|
| 5,663,905 A * | 9/1997 | Matsuo et al. | 365/149 |
| 5,777,922 A * | 7/1998 | Choi et al. | 365/185.05 |
| 5,994,949 A | 11/1999 | Menichelli | |
| 6,026,021 A * | 2/2000 | Hoang | 365/185.11 |
| 6,339,549 B1 * | 1/2002 | Jinbo et al. | 365/185.33 |
| 6,396,728 B1 * | 5/2002 | Abedifard et al. | 365/63 |
| 6,483,747 B2 * | 11/2002 | Choi et al. | 365/185.09 |
| 6,580,645 B1 | 6/2003 | Lin et al. | |
| 6,621,758 B2 * | 9/2003 | Cheung et al. | 365/230.03 |
| 6,678,191 B2 * | 1/2004 | Lee et al. | 365/185.33 |
| 6,831,862 B2 * | 12/2004 | Tedrow et al. | 365/185.21 |
| 6,958,272 B2 | 10/2005 | Lingunis et al. | |
| 7,006,402 B2 * | 2/2006 | Park et al. | 365/230.05 |
| 7,099,202 B1 * | 8/2006 | Son et al. | 365/189.05 |
| 7,102,928 B2 * | 9/2006 | Kawamura | 365/185.17 |
| 7,103,706 B1 | 9/2006 | Van Buskirk et al. | |
| 7,149,143 B2 | 12/2006 | Cioaca | |
| 7,177,190 B2 * | 2/2007 | Lee | 365/185.17 |
| 2005/0249019 A1 * | 11/2005 | Shin | 365/230.05 |

* cited by examiner

*Primary Examiner*—Son L Mai
(74) *Attorney, Agent, or Firm*—Amin, Turocy & Calvin, LLP

(57) ABSTRACT

Manners for transferring information within a flash memory device across a memory array are described. A controller retrieves information from a storage unit and then a decoder decodes the information. The information is set across a series of bitlines through a pass gate to a second controller. The bitlines are both associated with the storage unit as well as bitlines associated with other storage units. A series of transistors is associated with each bitline. Different transistors are active based on if the bitlines are associated with the currently used storage unit.

20 Claims, 9 Drawing Sheets

TRANSFER OF NON-ASSOCIATED INFORMATION ON FLASH MEMORY DEVICES

TECHNICAL FIELD

Disclosed herein are memory systems and in particular systems and methods for transferring information between data flow control units of flash memory devices.

BACKGROUND

Electronic devices with the ability to store information (electronic devices) are an important part of society. Electronic devices influence almost every aspect of life, ranging from business transactions to interpersonal communications. Examples of these devices are cellular telephones, personal digital assistants, and personal computers. One important aspect of electronic devices is the ability to store the information in digital memory, which stores information as a series of I/Os. A typical electronic device may have several different types of memory. One memory type is ROM (Read-Only Memory). ROM is a non-volatile memory type that a system can write to only once. Non-volatile memory is memory that can retain information without a draw from a constant source of power. ROM systems can read the information stored in the memory, but ROM systems cannot re-write new information to the memory.

Another type of memory in an electronic device is RAM (Random Access Memory), which is memory that allows information to be read in any order regardless of its stored sequence. RAM is the main working area for an electronic device. An electronic device can read the information stored in the RAM and an electronic device can write new information to the RAM. However, an undesirable aspect with RAM is that most types of RAM are volatile memory types, meaning that they need to draw from a constant source of power to retain their memory.

A common form of RAM is Dynamic Random Access Memory (DRAM). In an integrated circuit, each bit of data is stored in an individual capacitor as an I/O. The capacitors lose voltage due to natural leakage and stored data is lost unless the system recharges the capacitor. The reason for the term Dynamic refers to a constant activity taking place (e.g., the constant recharging of the capacitor). There are several variations on DRAM, such a video DRAM.

Other memory types exist in attempts to address undesirable aspects of ROM and RAM. One of the basic memory types created to address such aspects is EEPROM (Electrically Erasable Programmable Read Only Memory) which is both non-volatile and capable of multiple writes and reads. However, EEPROM is relatively expensive to manufacture, thus making use impractical for many personal applications. Flash memory technology is an alternative to EEPROM. In addition to processing the advantages of EEPROM (namely that the memory is readable, re-writable, and non-volatile); flash memory is also relatively cheap to mass-produce. The economic factor makes flash memory much more desirable for personal applications, such as storing of digital photographs and storing digital music files. Moreover, Flash memory devices generally have an expected life span of about one million programming cycles.

SUMMARY

The following presents a simplified summary of the disclosed information in order to provide a basic understanding of some aspects of the disclosed information. This summary is not an extensive overview of the disclosed information. It is intended to neither identify key or critical elements of disclosed information nor delineate the scope of the disclosed information. Its sole purpose is to present some concepts of the disclosed information in a simplified form as a prelude to the more detailed description that is presented later.

Conventional flash memory devices have a plurality of bitlines lined up along banks of a storage device. Information is extracted from the storage device and the information travels along bitlines associated to the bank that held the information (e.g., bitlines that connect to the bank). The disclosed innovation allows information to travel along bitlines that are both associated as well as not associated with the bank in which information is retrieved. The information can travel along all bitlines by adding more transistors to a Y-decoder and the creation of a four transistor Y-pass gate.

The following description and the annexed drawings set forth certain illustrative aspects of disclosed information. These aspects are indicative, however, of but a few of the various ways in which the principles of the disclosed information may be employed. Other advantages and novel features of the disclosed information will become apparent from the following detailed description of the disclosed information when considered in conjunction with the drawings.

DETAILED DESCRIPTION

Figure 1:
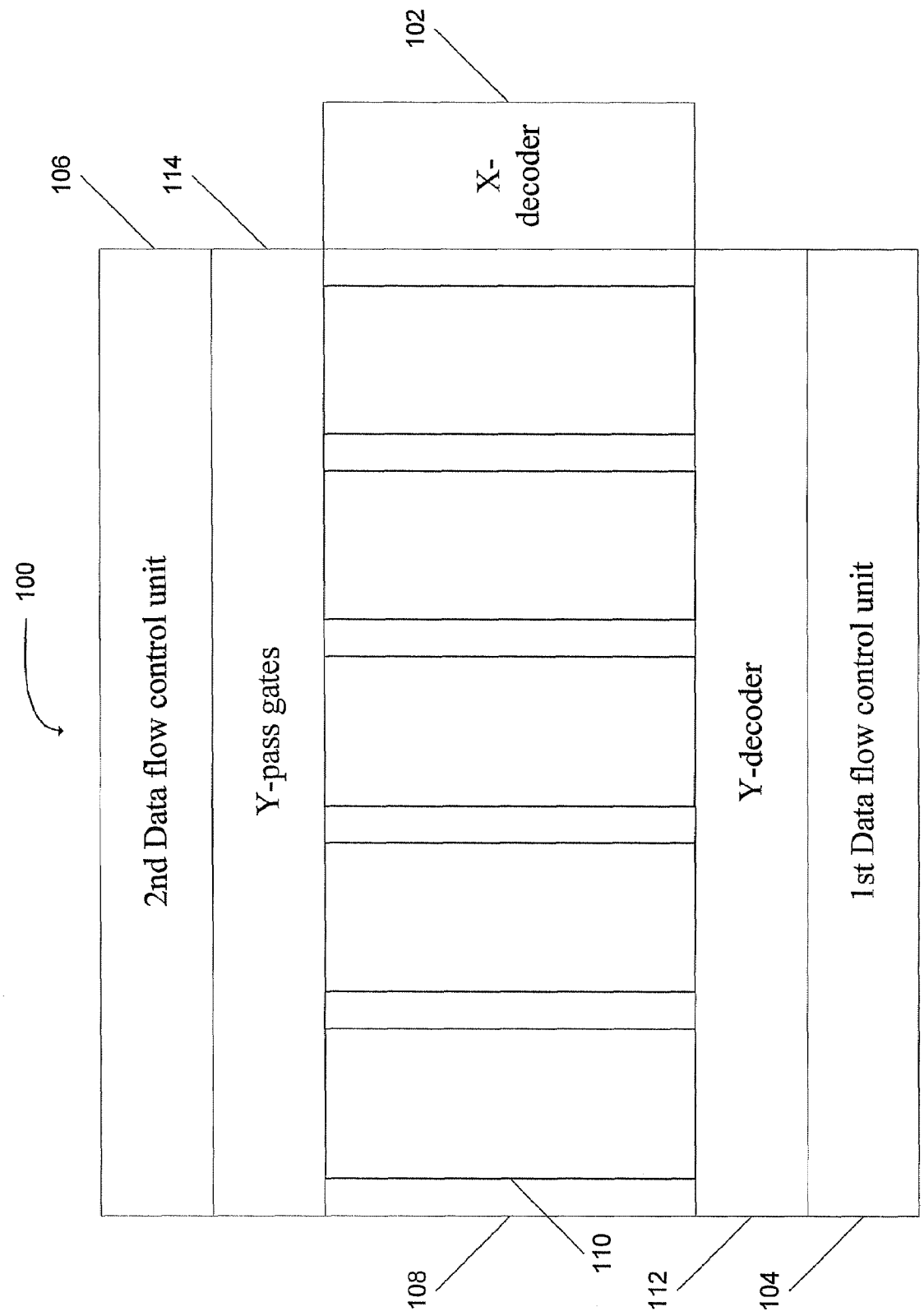
FIG. 1 illustrates a schematic block diagram of a partial flash memory device adapted to carry out various aspects of the innovation.

As utilized herein, the term "transistor" can refer to any semi-conductor device that controls a relatively large voltage with a relatively small voltage. The terms "unit", "device", "component" and the like are interchangeable. In addition, the terms "memory array", "storage unit", "storage location", "die", and the like are interchangeable. Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

A system and methodology is provided for transferring information within a flash memory device across a memory array. A set of transistors on both ends of a bitline allow information to travel across a memory array. Information is stored in a bank of a memory array and a data flow control unit retrieves the information. A decoding unit, such as a Y-decoder, decodes the retrieved information. The decoding circuit contains a multiplexer circuit that can include two lines, $Bl_0$ and $Bl_1$. The decoding circuit merges into a single bitline and the single bitline carries the information across the array. Once the bitline passes the array, the bitline splits into two lines, $Bl_0$ and $Bl_1$, at a Y-pass gate, which is another multiplexer circuit. Once the information splits at the Y-pass gate, the information continues to a second data flow control unit.

In total, each bitline can be associated with eight transistors, for example. If a bitline is associated with the memory retrieval bank, then a controller activates a specific set of transistors. If a bitline is not associated with the memory retrieval bank, then a controller activates an opposite set of transistors. This action allows two separate and independent data flow control units to communicate with one another. Each of the transistor sets activate as subsets, meaning that one subset is active while another subset is inactive.

In one particular aspect of the flash memory device disclosed herein, in usual operation, only one bank can be in use for retrieval of information at one time. While a control unit is retrieving information from a bank, all other banks and their subsequent bitlines are inactive. Consequently, bitlines on non-retrieval banks are used that would not otherwise be in use. The more banks present in a memory array and the more bitlines per bank, the more information that can travel between the two data flow control units.

In a conventional flash memory device, only the bitlines associated with the banks where the information is stored are used. Large quantities of bitlines are passive while a large amount of information is passing through a small segment of bitlines. Unlike conventional flash memory devices, the flash memory device disclosed herein uses bitlines that conventional flash memory devices do not use, thus allowing increased processing speeds. The flash memory device disclosed herein constitutes a unique approach to communication between two control devices. Other known configurations do not allow use of bitlines that are on non-associated banks.

The flash memory device disclosed herein show the usual case where there is use of a separate set of bus lines. Conventional flash memory devices have a set of bus lines that only function as an additional transportation means. The flash memory device disclosed herein eliminates a necessity for an added set of bus lines, although the disclosed information can be practiced with bus lines in place. Using already existent bitlines allows for fewer components, which leads to increased readability because there are fewer components that can break down. Additionally, adding a set of bus lines positioned around a memory array can undesirably increase the physical size of the device. Since personal applications are the largest segment of flash memory development, increasing the physical size of the device a negative attribute. In addition, since the set of bus lines are positioned around the memory array while bitlines go through the array, there is less distance traveled and thus a faster processing speed when using bitlines.

The configuration for flash memory devices disclosed herein allows for lower costs since there is no need to add a set of bus lines. Additionally, since the non-associated bitlines that are already present are used, there is no increase in the die size. The use of the non-associated bitlines is suitable for high density, large area, and precision programming flash memories.

Flash memory devices contain of an array of banks that store information making up a memory array. On top of these banks are wordlines and bitlines that carry the information across the memory array. The bitlines and wordlines are typically perpendicular to one another and thereby forming a matrix. The wordlines connect to an X-decoder while the bitlines connect to a Y-decoder. In a standard flash memory device, the Y-decoder connects directly with a data flow control unit. The decoders prepare the information for communication with an external system (e.g., a cellular telephone or a personal digital assistant). A data flow control unit communicates the decoded information to the external system through a series of I/O ports. Increased memory size of a flash memory device can increase the size of the overall array. However, in many instances one data flow control unit is not sufficient to handle the amount of information that can be stored in the array. In addition, when the array size is increased, the processing time becomes undesirably longer because the information has a longer distance to travel across the array since the array has an increased size. To address this issue, a second data flow control unit assists the first data flow control unit. The location of the second control unit is typically away from the Y-decoder across the memory array.

Communication between two data flow control units occurs by transferring information across the bitlines of the bank where the memory is stored. To increase both the size of the array (and subsequently the unit's storage capacity) as well as increase processing speeds, there can be an addition of bus lines that assist in the communication between a first data control unit and second data control unit. The two data flow control units communicate together when sending the information to the external system. The bus lines can number into the hundreds. The length of the bus lines is a directly related to the size of the data flow control units and the size of the array, since the bus lines surround the memory array. The flash memory device disclosed herein addresses the concern of effectively reading stored information. However, disclosed information can also apply to programming and erasing the cell and the overall memory array as well as other applications.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Figure 2:
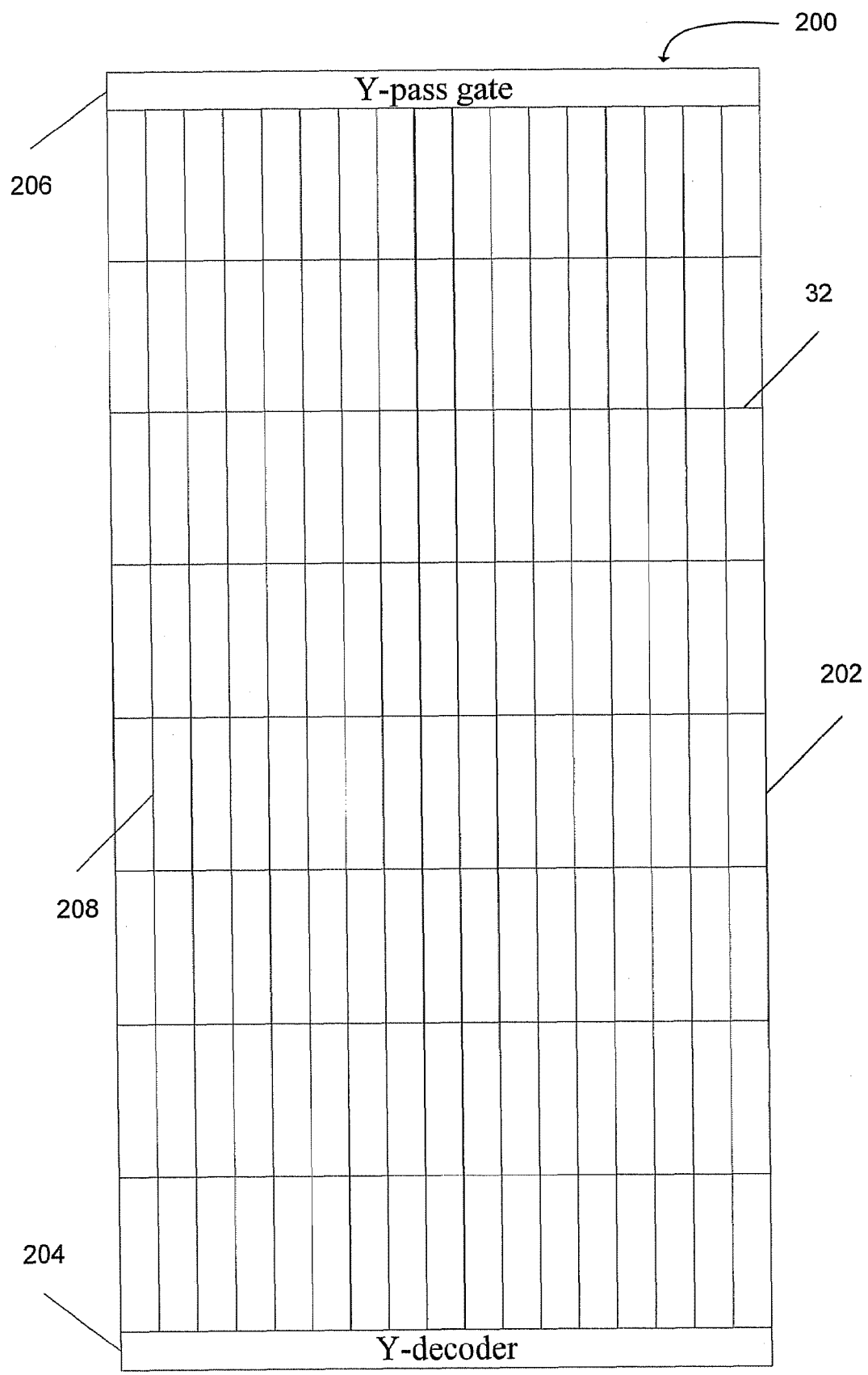
FIG. 2 illustrates a partial top view of a standard bank in a memory array with a connecting Y-component.

FIG. 1 illustrates an exemplary flash memory array, control unit, and decoder arrangement, hereafter known as unit 100. A typical flash memory unit 100 comprises two decoders, typically an X-decoder 102 and a Y-decoder 112, at least one Y-pass gate 114, a first and a second data control unit, 104 and 106 respectively, and a memory array 108. The decoders 102, 112 function for decoding stored information that travels across bitlines 30 and wordlines 32 from the memory array 108. The pass gate 114 functions to break down information into I/Os for processing by a data control unit 106. The control units 104, 106 function to process the information for communication with a host system as well as to operate most other components in a flash memory device. The memory array 108 is a storage area where the flash memory unit stores information. The memory array 108 in FIG. 2 shows five banks 110, although fewer or additional banks may be present. Banks 110 function as the individual storage sectors that make up a memory array 108. While this drawing shows five banks 110, a memory array can have any number of banks, including a single bank 110. In addition, while there are unused spaces between each of the banks 110 in the memory array 108, spaces are not necessary.

A set of control units 104 and 106 control the system. The first control unit 104 retrieves information from a bank 110. The first control unit connects to the Y-decoder where information is decoded. The decoding involves of converting the information into a state where the information can travel across a single carry line 30. The information travels from the Y-decoder 112 to a bitline 30. The bitline 30 carries the information across the memory array. The information travels along a bitline 30 into a Y-pass gate 114. The Y-pass gate 114 takes the information and converts the information into the format the information had in prior to going into the Y-decoder 112. Once the information is properly converted, the Y-pass gate 114 sends the information to the second control unit 106. The second control unit 106 then sends the information to an external system such as a cellular phone. In the arrangement of FIG. 2, functional names appear for several of the devices, such as a first and second control unit 104 and 106 respectively. However, these names are dynamic based on the function of each device. For instance, if the control unit 106 calls for the retrieval of the information as opposed to the control unit 104, then control unit 106 functions as the first control unit, the Y-pass gate 114 functions as the Y-decoder, and the Y-decoder 112 functions as the Y-pass gate.

FIG. 2 illustrates an example bitline and circuit component system 200. A standard flash memory device may have the same configuration for all banks in a memory array. In this instance, the configuration is the same for retrieval memory banks and non-retrieval memory banks. Individual cells typically form a bank 202. Placed beneath or above the cells are bitlines 208. Each bitline 208 can be made of a conductive material, such a metal or doped polysilicon. The bitlines 208 also commonly contain an additional oxide portion. Attached to the bank 202 are a number of bitlines 208. While the current configuration is of sixteen bitlines 208, the configuration can be of any number of bitlines 208. The bitlines 208 function as the paths on which information travels between the bottom of the memory array and the top of the memory array or visa versa, depending on the specific operation. Typical flash memory banks 202 also have wordlines 32 running perpendicular to the bitlines 208 that send information to an X-decoder. When information is retrieved from one bank and sent to data flow control units, the other banks are typically not in use and the non-used bank bitlines 208 are in an idle state. The flash memory device disclosed herein uses these non-used bank bitlines 208 for increasing the operation speed of a flash memory device.

Figure 3:
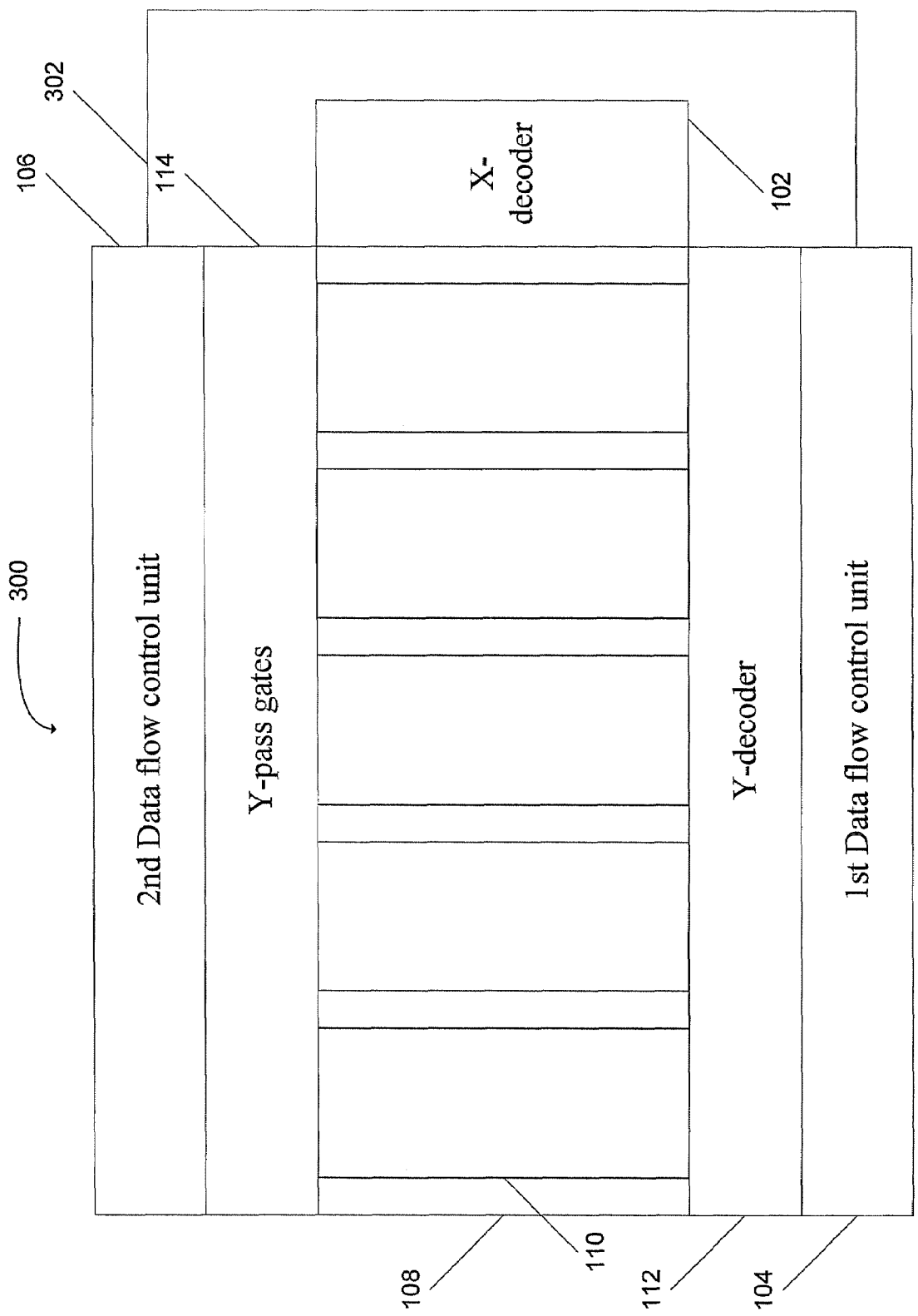
FIG. 3 illustrates a block diagram of a flash memory device with a set of bus lines adapted to carry out various aspects of the innovation.

The retrieval bank wordlines 32 are high voltage and the non-retrieval bank wordlines 32 are inactive since the non-retrieval banks 202 themselves are inactive. Also shown in FIG. 3 are the circuit component of a Y-decoder 204 and a Y-pass gate 206. The Y-decoder 204 and the Y-pass gate 206 connect to the bitlines and contain transistors. These transistors allow the information to pass to the data flow control units and to the bitline. While the Y-decoder 204 and the Y-pass gate 206 are only extending the width of the single bank displayed, the Y-decoder 204 and Y-pass gate 206 extend the width of all banks in the memory array. The typical flash memory device has two transistors associated with the bitlines 208 in the Y-decoder 204 that are designated for information traveling across the bitlines 208. A commonly transistor used toward information transfer is a MOSFET transistor. Here, there are not only an additional two transistors added in the decoder, but also a de-multiplexer circuit, the Y-pass gate 206. The Y-pass gate 206 adds another four transistors 28a-d to the bitlines, creating a total of eight transistors for transporting information.

FIG. 3 illustrates an exemplary flash memory array, control unit, and decoder arrangement, which is similar to the unit 300 as in FIG. 1. The difference between this figure and FIG. 1 is there is the addition of a set of bus lines 302 in FIG. 3. The set of bus lines allow information to travel between the first data control unit 104 and the second data control unit 106. The bus lines 302 facilitate full communication between the two control units regardless of the use of non-associated bitlines. However, as stated earlier, information traveling across bus lines takes a longer time then using a flash memory device's bitlines.

The purpose of FIG. 3 is to show that the flash memory device disclosed within can work in conjunction with a set of bus lines 302. The control units can send information along the associated bitlines, the non-associated bitlines, and the bus lines. The configuration of FIG. 3 can be the beneficial when there are large amounts of information for processing. In practice, arrangement of FIG. 3 can have communication using one, two, or all three of the associated bitlines, the non-associated bitlines, and the bus lines. In other words, while all three transportation devices are on the same devices, the system can use any number or combination of the devices.

For example, there can be a configuration in a control unit implementing the use of only associated bitlines if the retrieved information is of a size about equal or less than X. If the retrieved information size is between X and Y, then both associated and non-associated bitlines are used. If the retrieved information size is about equal or greater then Y, than use both bitline types and bus lines. X and Y are variables for information size. Using bus lines 40 in some instances allows for more uniform processing times, since different amounts of information can have similar processing times.

Figure 4:
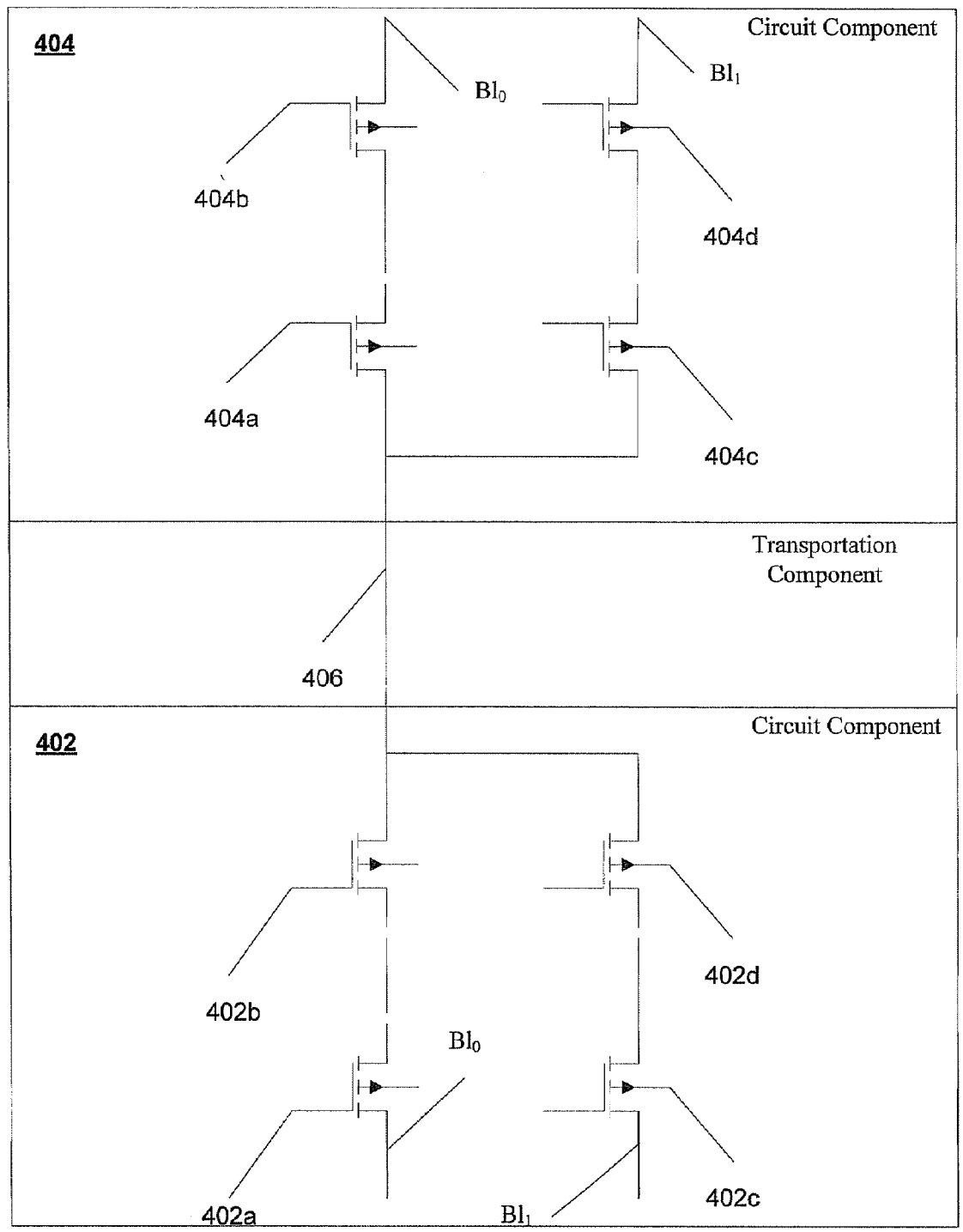
FIG. 4 illustrates a schematic block diagram of a bitline circuit for allowing information to pass through independent of if the information is from the bitline's associated bank.

FIG. 4 illustrates an example transistor bitline configuration. The displayed configuration has a circuit component and a transportation component. A typical circuit component comprises a Y-decoder 402 and a Y-pass gate 404 while a standard transportation component contains at least one bitline 406. The Y-decoder 402 and the Y-pass gate 404 each contain a plurality of transistors, such as four transistors for example. The information travels from a control unit to the Y-decoder 402. The information travels from the Y-decoder 402 to a bitline 406 thereby moving across a memory bank. The bitline 406 terminates at the Y-pass gate 404. The Y-pass gate 404 sends the information to a second control unit.

The configuration of the circuit component is may be the same or different in each bank of a memory array. The circuit configuration can commonly be described as a "mux" circuit or a "multiplexer" circuit if the circuit functions with multiple inputs and a single output. The circuit configuration can be described as a "de-mux" circuit or a "de-multiplexer" circuit if the circuit functions with a single input and multiple outputs. Transistors in the circuit component operate differently depending on whether the circuit connects to a bitline that is located on the bank where the memory is located. If the circuit is associated with a bank-associated bitline, then transistors 402a, 402c, 404a, and 404c are in operation while the other transistors are in an off state. If the circuit is associated with a non-bank associated bitline, then transistors 402b, 402d, 404b, and 404d are in operation while the other transistors are in an off state. Therefore, all bitlines can have information travel across them regardless if the bitlines are associated with the bank where the transported piece of memory is stored based on above mentioned processing.

In an occurrence for a bitline 406 to split into two bitlines, $Bl_0$ and $Bl_1$ to merge into a carry line 406 for transport across a flash memory unit. Typically, the carry line is made of metal. Once the metal carry line 406 carries the information through the memory array, the metal carry line 406 usually splits again into $Bl_0$ and $Bl_1$, which allows the Y-pass gate 404 to perform encoding. The Y-pass gate acts as a de-multiplexer circuit. A multiplexer circuit takes two or more data channels and creates one data channel based on the information. A de-multiplexer takes one data channel and creates two or more data channels based on the information.

In the flash memory device system, a transportation component is capable of carrying both associated and non-associated information. The system may be implemented on a flash memory device. The transportation component may attach to a storage site, such as a bank of a memory array. The circuit component may at least one transistor, and many times has about eight transistors. The transportation component is capable of carrying information that the transportation component is not associated with only when four transistors are in an on state and four transistors are in an off state. The transportation component carries associated information with activation of the reverse set of transistors. The circuit component may terminate at a control unit. In addition, the circuit component originates at a control unit.

In a flash memory device disclosed herein, there is a means for transporting non-associated information and a means for enabling the means for transporting non-associated information. In addition, there may be a means for transporting associated information. Usually, this means for transporting associated information is enabled by the means for transporting non-associated information. With this configuration, there may be a means for retrieving the information. When there is a means for retrieving the information, there may be a means for storage that stores information. In addition, there is also a means for controlling the means for enabling.

Figure 5:
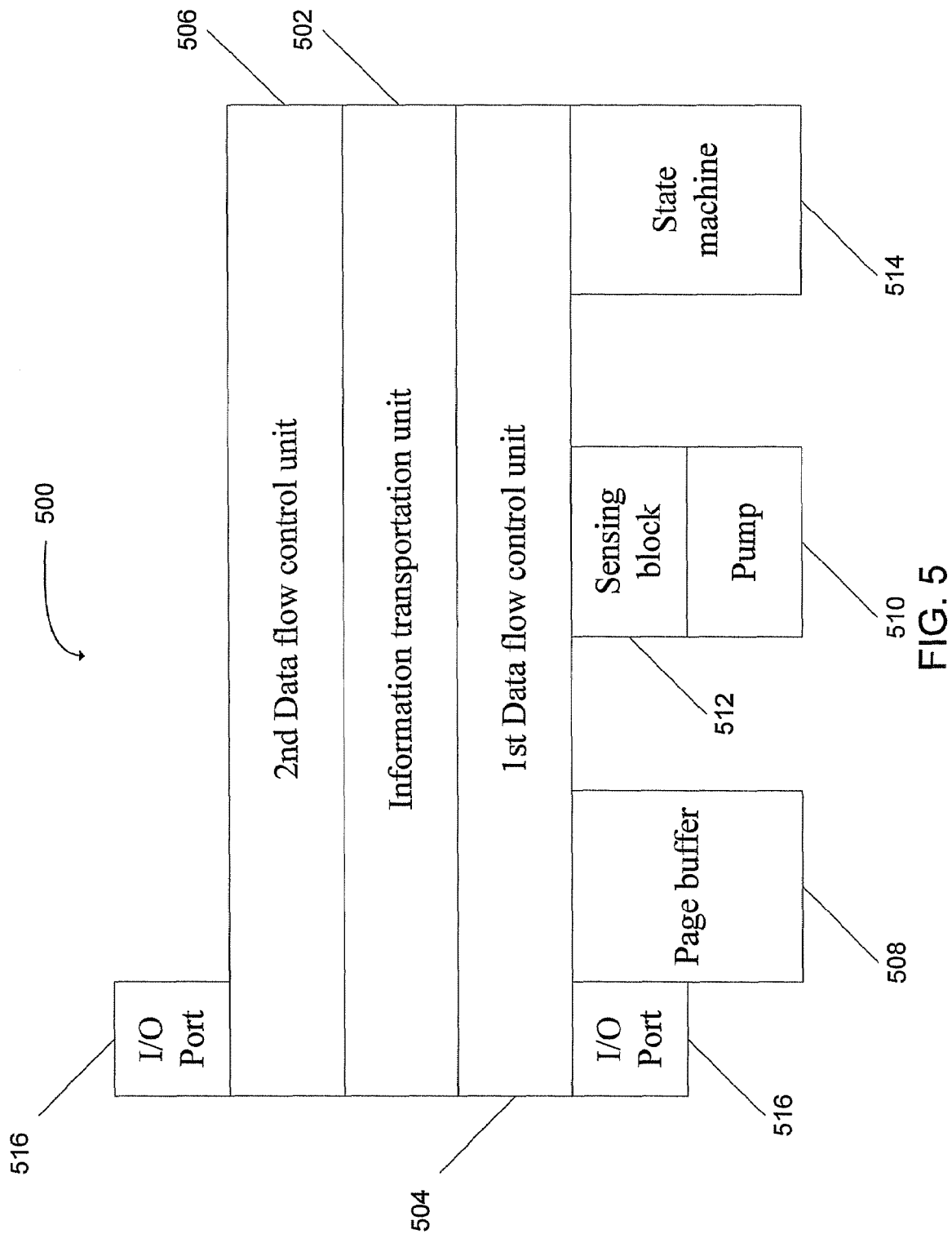
FIG. 5 illustrates a block diagram of an integrated flash memory device.

FIG. 5 illustrates the information structure in conjunction with other typical units in a flash memory device 500. This diagram is intended to neither show an inclusive list of all things that could be present nor show what other elements must be present. The information transportation unit 502 (e.g., transportation component), first data flow control unit 504, and second data flow control unit 506 are disclosed in other areas. In a typical flash memory device, several other devices are present that perform certain tasks in the device.

A page buffer 508 is a location that temporarily holds information. Temporary storage of information takes place because the rate the first data flow control unit can retrieve information from the memory array is sometimes different then the rate of conversion for the Y-decoder. If stored information exits a memory array faster than a control unit can process the information, then the non-processed information can temporarily remain in a page buffer 508.

A pump 510 provides a charge necessary for erasing existing data and writing new data. The pump 510 is often referred to as a HV pump (High Voltage pump). This is because, for example, the pump can produce a voltage of about 10V, which is used for writing to the memory array while the flash memory device typically operates at about 2.4V. The pump operates as to allow a flash memory device to operate from a standard power supply.

A sensing block 512 is a typical sensor that monitors the operations inside of the flash memory device. A state machine 514 helps to automate the programming and erasing processes, which is controlled by an algorithm. I/O ports 516 connect the flash memory device to an external system. The external system can be anything capable of receiving information from the flash memory device. For example, the external system can be a cellular telephone or personal digital assistant. A possibility is that external system power to the flash memory device is provided through the I/O ports.

Figure 6:
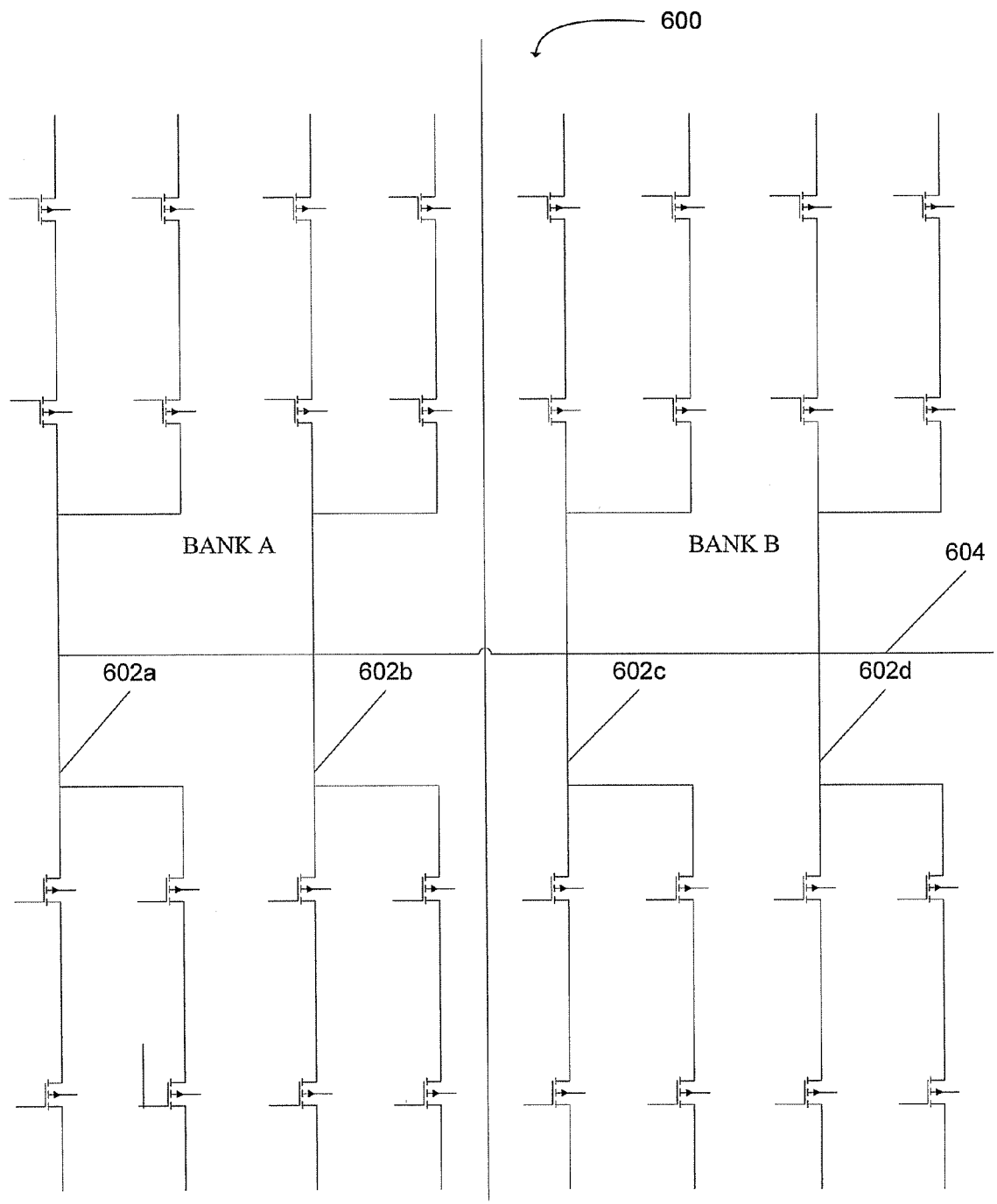
FIG. 6 illustrates a schematic diagram of two banks with multiple bitlines and appropriate transistors.

FIG. 6 illustrates an example two-bank configuration with two bitlines per bank. This figure shows a configuration similar to the configuration of FIG. 4 except there is a multi-bank configuration. FIG. 6 displays four bitlines 602a-d. These four bitlines connect to four transistors each, making sixteen displayed transistors. In addition, a wordline 604 connects with each one of the bitlines 602a-d. A divider separates Bank A and Bank B and each bank is designated with their corresponding name. Bitlines 602a and 602b are located in Bank A and bitlines 602c and 602d are located in Bank B.

In conventional operation, if the information transferred came from Bank A, only bitlines 602a and 602b would activate. However, in the flash memory device disclosed herein, all four bitlines activate for communicating information. A data flow control unit retrieves information from Bank A. For example purposes, there are four bits of information. One bit travels to each of the four bitlines 602a-d. The Y-decoder decodes the information. Once the information is decoded, the information travels across the metal carry lines to the Y-pass gate. The Y-pass gate converts the information into its original format. The information then travels to the data flow control unit for further processing. On FIG. 6, the Y-decoder and Y-pass gate are not numerically designated. While for much of the flash memory device disclosed herein, the bottom transistor set is a Y-decoder and the top is a Y-pass gate, this does not have to be the configuration. The both the top and the bottom can function as a Y-pass gate and a Y-decoder at any time.

Figure 7:
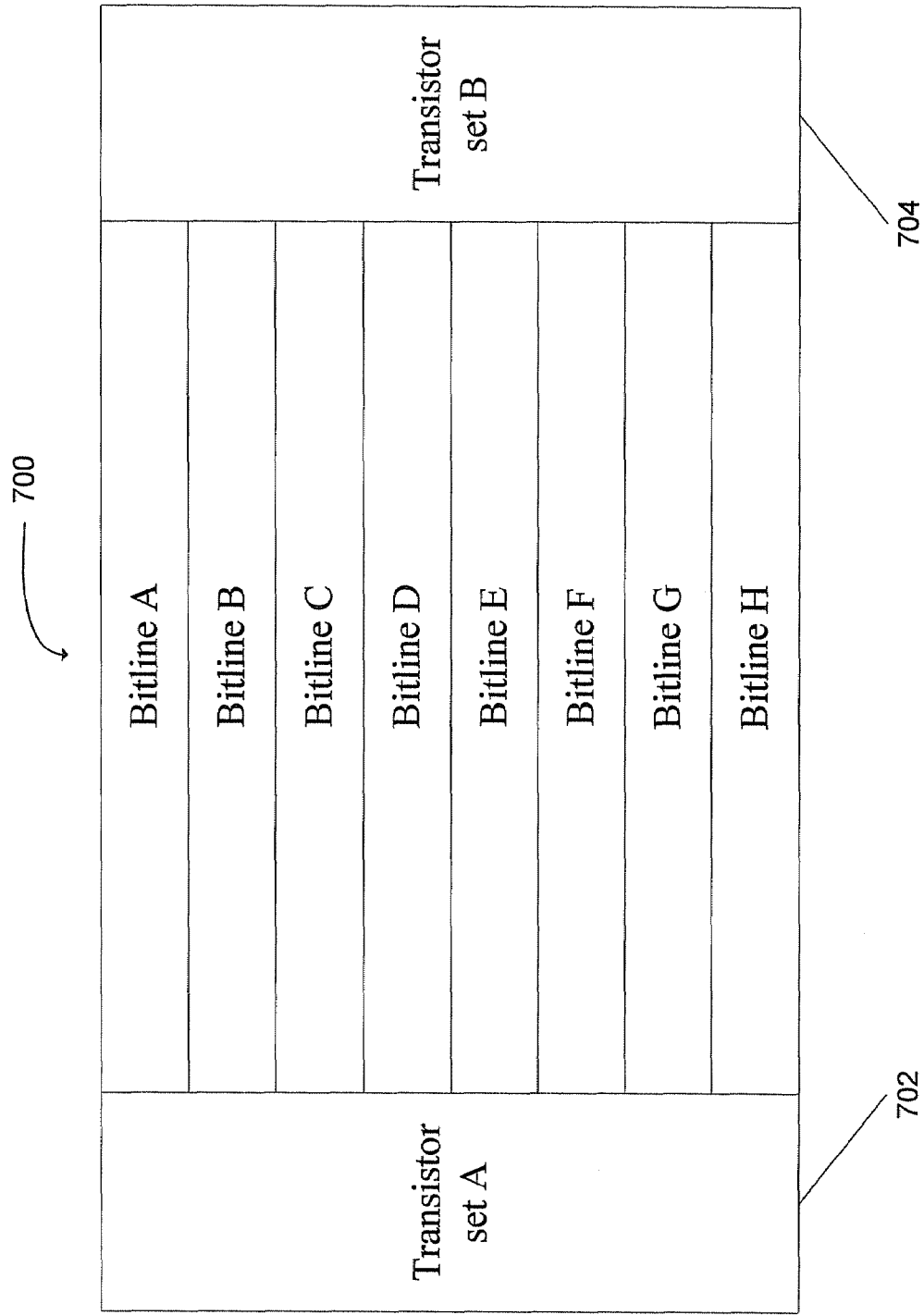
FIG. 7 illustrates a schematic block diagram of an eight bitline, four-bank configuration with appropriate transistors.

FIG. 7 illustrates an exemplary four-bank system 700. The system shows a first transistor set 702 and a second transistor set 704 on the right and left sides respectively. The transistor sets can be placed in any location and configuration in the flash memory device. Eight bitlines are each designated as Bitlines A-H. Bitlines A and B are in Bank A. Bitlines C and D are in Bank B. Bitlines E and F are in Bank C. Bitlines G and H are in Bank D. Two operations can take place at the same time within a flash memory device. For example, a first data flow control unit retrieves information from Bank A. The first data flow control unit sends information to the first transistor set 702 and the information travels down Bitlines A-D. The information reaches the second transistor set 704 and travels to a second data flow control unit. In this communication, the first transistor set functions as a Y-decoder and the second transistor set functions as a Y-pass gate.

Simultaneously, a second data flow control unit retrieves information from Bank C. The second data flow control unit sends information to the second transistor set 704 and the information travels down Bitlines E-H. The information reaches the first transistor set 702 and travels to a first data flow control unit. In this communication, the second transistor set functions as a Y-decoder and the first transistor set functions as a Y-pass gate. Therefore, both transistor sets can function as a Y-decoder and a Y-pass gate at the same time since each bitline's transistors are independent of one another. There can be another communication device between the two data flow control units so information is not sent down the same bitline from different directions, such as a set of bus lines. While many flash memory devices only allow for retrieval from one bank at one time, the disclosed information also applies to a system that can retrieve from multiple banks at one time.

There are several other uses for adding additional bus lines. First, the bus lines can be in place for an emergency. For example, a failure can occur that does not allow the traveling of information across the non-associated bitlines. In this instance, there can be a function in either control unit that sends the information across a set of bus lines. While a less productive use of disclosed information, one can initially send the information across the bus lines and only use the non-associated bit lines if a failure occurs along the bus lines.

Figure 8:
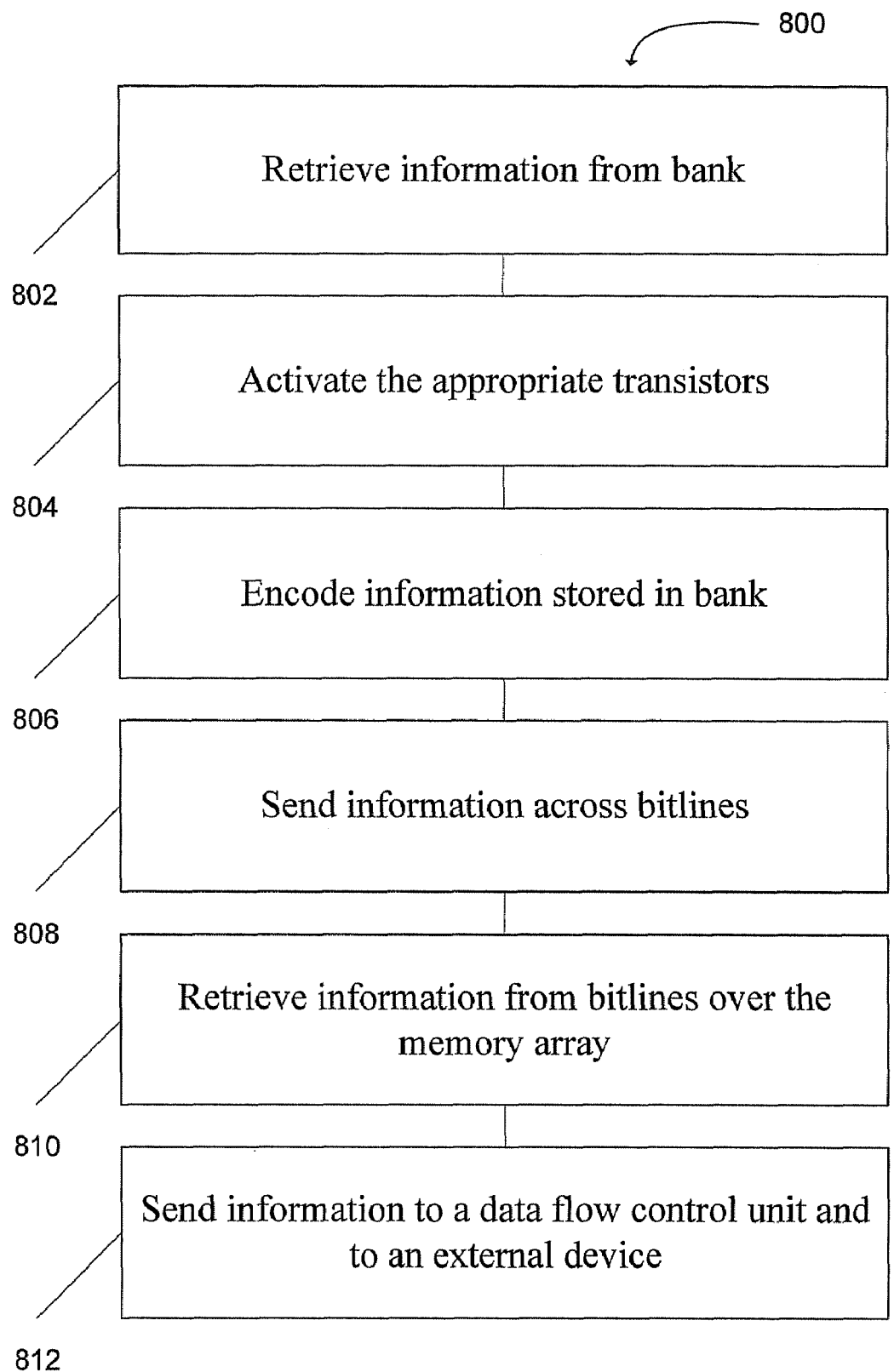
FIG. 8 illustrates a flow diagram of a methodology for communicating data stored in a memory location between two control units.

FIG. 8 illustrates one particular methodology 800 for performing an information transfer on a flash memory unit in accordance with disclosed information. The method beings at 802, where a first data flow control unit retrieves information that is stored in a bank and the information is retrieved to a Y-decoder. An example of information that may be stored is a document in '.doc' format. This retrieval is initiated by a command from a host system in many occurrences, for example, a user inputted command from an attached cellular telephone.

The next act in the methodology is 804, which is an activation of necessary transistors takes place from their idle state for information transfer. However, there is a possibility that transistors are in states other then idle. For instance, if the transistors are transporting associated information, the transistor states can be reversed to allow for the transportation of non-associated information without using an idle state. These transistors should connect to bitline, where the bitline serves as a path for the information to travel. The transistors make up a Y-decoder and a Y-pass gate. A set of transistors should be in an 'on' state while another set of transistors should be in an 'off' state. The controller determines which transistors are in an 'on' state based on if the bitline is associated with the retrieved bank. Retrieved bank bitline transistors and non-retrieved bank bitline transistors should be at opposite states of each other. One single controller can set the state for both the bank associated bitlines as well as the non-bank associated bitlines; however, multiple controllers can perform the operation of assigning transistor states. The transistor activation can be done by any manner or device, such as determination by a separate microprocessor or determined by a data flow control unit.

The methodology advances to 806. At 806, the Y-decoder 26 encodes the information. Encoding the information changes information from two separate lines and prepares the information to travel along a single carry line. One set of transistors encode the information as to its state 'I' or 'O', while one set of transistors encode the information regarding the location of the bitline (e.g., if the bitline is a bank-associated bitline or a non-bank associated bitline).

Once appropriate transistors activate to their appropriate state and information is properly decoded, the methodology continues to step 808 where the information travels across the bitline by a component sending the information down the bitline 30. A data flow control unit may issue a command that once the information is decoded, the information should be immediately sent down the carry line. This enables the information to travel across both bank bitlines and non-bank bitlines. While often the system configures to allow information to travel across all bitlines, the system can also use alternative configurations where only some of the non-bank bitlines are used, where no non-bank bitlines are used, or where no bank bitlines are used.

Once the sent information goes across the bitline, then act 810 of the methodology takes place. This is where the Y-pass gate operates as a de-multiplexer circuit and retrieves the information from the bitline. Once information goes through the bitline 30, the information arrives at another set of transistors. These transistors activated at act 804 and should mirror the transistor set-up of the first set of transistors for each bitline. One set of transistors encodes the information as to state "I" or "O". One set of transistors encodes the information regarding the location of the bitline (e.g., if the bitline is a bank-associated bitline or a non-bank associated bitline). Action 810 decodes the information, reversing encoding at act 806.

Finally, the methodology arrives at act 812. At act 812, the information goes from the transistors to the data flow control unit. The data flow control unit prepares the information for sending to an external component. For example, the data flow control unit can be in communication with a cellular telephone and the information travels to the cellular telephone. A series of I/O ports attached to the external system typically makes this connection to allow communication. Once processed, the information is sent to the external device.

The method 800 configures the overall system to allow communication between the two data control units. The method allows information to pass from a first part of a memory array to a second part of a memory array (e.g., from the bottom of a memory array to the top of a memory array). In addition, the flash memory device disclosed herein can configure to allow some bitlines to send information from a first part of a memory array to a second part of a memory array (e.g., the top of the memory array to the bottom of the memory array). Simultaneously other bitlines send information from the second part of the memory array to the first part of the memory array (e.g., the bottom of the memory array to the top of the memory array). Furthermore, this configuration can allow for communication between other devices besides two data flow control units, such as direct communication between a buffer and an eternal system.

Figure 9:
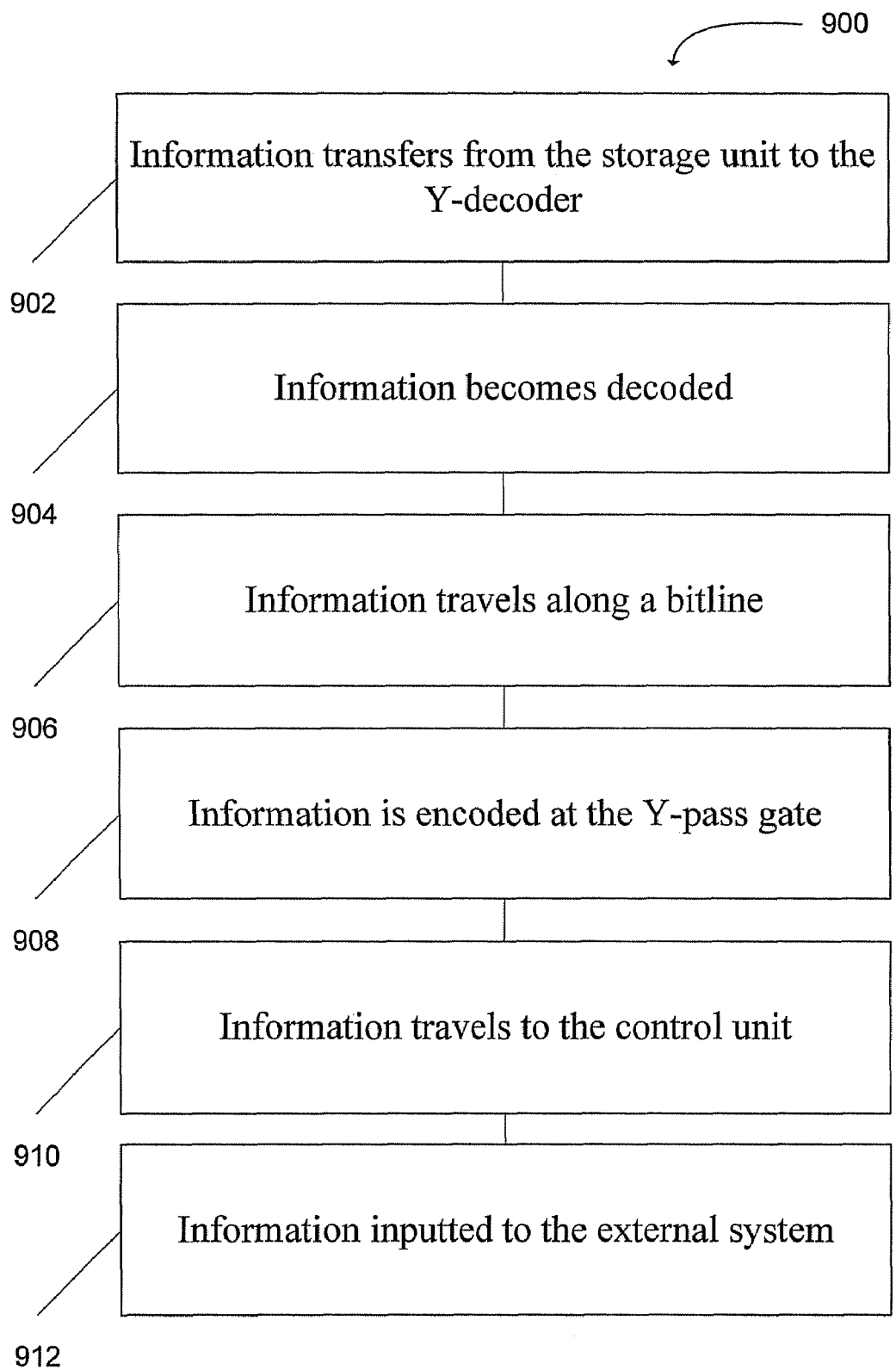
FIG. 9 illustrates a flow diagram of the manipulation of the information through the flash memory device.

FIG. 9 illustrates a manipulation of the data through the flash memory device disclosed herein 900. At 902, a controller retrieves information from the storage unit, specifically from a single bank. While typically a data flow control unit performs this retrieval, a separate device can also retrieve the information. During the retrieval, the information goes to the Y-decoder wherein the Y-decoder is a set of transistors.

By way of example, there are two banks, with two bitlines for each bank. The banks are made of a plurality of memory cells where each cell contains a bit of information. For this example, the bank contains four cells and thus four bits of information. The controller retrieves each bit from the bank and one bit travels to each of the four transistor sets, one for each bitline. Disclosed information can also be practiced in flash memory devices that contain more than one bit per cell, for example, with dual-bit cells or quad-bit cells.

At 904, the information becomes decoded. The information travels through the decoding configuration. For simplified example, all the bits are at an "I" state. If the bits were not all the same state, two transistors configure the information based on their state. Two of the transistors configure the information so the system can determine if the information is traveling along an associated or a non-associated bitline. Using the current example, two of the bits are decoded as non-associated and two are decoded as associated.

At 906, the information travels across corresponding bitlines. With the flash memory device disclosed herein, the information travels at twice the speed of a conventional flash memory device. With conventional flash memory, the first two bits travel across the two bank associated bitlines. Once this is complete, the second two bits travel across the two bank associated bitlines. With the flash memory device disclosed herein, all four bits travel at the same time by traveling across all four bitlines. While the present example doubles the speed, if there are sixteen equal bitline banks, the speed increases by a factor of sixteen. A greater increase in speed can take place if in addition to the use of non-associated bitlines an implementation of bus line occurs for faster processing operations.

At 908, the Y-pass gate encodes the information. The action 908 reverses the operation performed at act 904. Information is deconstructed based on if the information traveled on an associated or non-associated bitline, which allows the second data flow control unit to determine from where the information was originally stored. Encoded information travels to the control unit at act 910. The control unit can perform further processing, such as identifying the format of the information to assist an attached external system. The information then communicates with the external system at act 912. For instance, if stored information were a ".doc" file, the information could go to an electronic device, such as a cellular telephone. The external system performs an operation on the data, such as displaying the data on a screen or saving the data to internal memory. No requirement exists that the information be communicated to an external system. For example, the information stored in the memory cell can be in a compressed format. A data flow control unit can uncompress the information and determine the uncompressed size. Then, the data flow control unit can report the size of the uncompressed information to an external system while re-storing the information in the former memory location.

What is described above includes examples of the disclosed information. It is, of course, not possible to describe every conceivable combination of components or methodologies for purposes of describing the disclosed information, but one of ordinary skill in the art may recognize that many further combinations and permutations of the disclosed information are possible. Accordingly, the disclosed information is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising: is interpreted when employed as a transitional word in a claim.

What is claimed is:

1. A method for digital information transportation, comprising:
    retrieving information from a physical storage location associated with at least one carry line; and
    sending at least a portion of the retrieved information across at least one associated carry line and at least one non-associated carry line simultaneously.

2. The method of claim 1, further comprising setting a state for at least one transistor coupled with an associated carry line and at least one transistor coupled with a non-associated carry line.

3. The method of claim 2, further comprising setting a state at least eight transistors coupled with an associated carry line and at least eight transistors coupled with a non-associated carry line.

4. The method of claim 1, further comprising encoding at least a portion of the retrieved information.

5. The method of claim 4, further comprising decoding at least a portion of the retrieved information.

6. The method of claim 5, further comprising transporting at least a portion of the decoded retrieved information to an external component, through use of a series of I/O ports.

7. The system of claim 6, transporting decoded retrieved information to an external component occurs through use of a series of I/O ports.

8. The system of claim 6, further comprising activating at least one appropriate transistor for the at least one associated carry line or the at least one non-associated carry line, sending retrieved information simultaneously occurs upon activation of the at least one appropriate transistor.

9. The system of claim 8, the at least one associated carry line unites with at least eight transistors with at least four on each side of the associated carry line and the at least one non-associated carry line unites with at least eight transistors at least four on each side of the non-associated carry line.

10. The system of claim 9, the at least one associated carry line unites with eight transistors with four on each side of the associated carry line and the at least one non-associated carry line unites with eight transistors with four on each side of the non-associated carry line, when sending retrieved information across at least one associated carry line and at least one non-associated carry line simultaneously, two transistors are activated on each side of the associated carry line and two transistors are inactive on each side of the associated carry line while two transistors are activated on each side of the non-associated carry line and two transistors are inactive on each side of the non-associated carry line.

11. A system for digital information transportation, comprising:
    a transportation component associated with a memory bank; and
    a circuit component that processes information according to a relationship the information has with the memory bank for movement across the transportation component, wherein the circuit component comprises at least eight transistors and the transportation component is capable of carrying information that the transportation component is not associated with only when four transistors of the at least eight transistors are in an on state and four transistors of the at least eight transistors are in an off state.

12. The system of claim 11, wherein the transportation component is attached to a storage site.

13. The system of claim 11, wherein the system is implemented on a flash memory device.

14. The system of claim 11, wherein the circuit component terminates at a control component.

15. The system of claim 11, wherein the circuit component originates at a control component.

16. A system for digital information transportation, comprising:
    a transportation component affiliated with a memory bank; and
    a circuit component that includes at least four transistors and facilitates movement of information that is not part of the memory bank affiliated with the transportation component across the transportation component, the transportation component is capable of moving information that is not part of the memory bank affiliated with the transportation component across the transportation component when at least two of the at least four transistors is in an on state and at least two of the at least four transistors is in an off state.

17. The system of claim 16, the circuit component includes at least eight transistors and the transportation component is capable of moving information that is not part of the memory bank affiliated with the transportation component across the transportation component when at least four of the at least eight transistors is in an on state and at least four of the at least eight transistors is in an off state.

18. The system of claim 17, at least four of the transistors are on a primary side of the transportation component and at least four of the transistors are on an opposite side of the transportation component.

19. The system of claim 16, the circuit component includes an even number of transistors and the transportation component is capable of moving information that is not part of the memory bank affiliated with the transportation component across the transportation component when about half of the transistors is in an on state and about half of the transistors is in an off state.

20. The system of claim 19, further comprising the memory bank affiliated with the transportation component, the memory bank is one of at least two memory banks of a storage array and capable of moving information that is not part of the memory bank affiliated with the transportation component across the transportation component as well as moving information that is part of the memory bank affiliated with the transportation component across the transportation component.

* * * * *